(12) United States Patent
Chiu et al.

(10) Patent No.: US 7,755,186 B2
(45) Date of Patent: Jul. 13, 2010

(54) COOLING SOLUTIONS FOR DIE-DOWN INTEGRATED CIRCUIT PACKAGES

(75) Inventors: Chia-Pin Chiu, Tempe, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 12/006,263

(22) Filed: Dec. 31, 2007

(65) Prior Publication Data

US 2009/0166855 A1 Jul. 2, 2009

(51) Int. Cl.
*H01L 23/34* (2006.01)

(52) U.S. Cl. .................. 257/714; 257/712; 257/721

(58) Field of Classification Search .............. 257/675, 257/706, 714, 717, 722, 712, 721; 361/274.2, 361/676, 679.53, 679.46, 679.47, 689, 698, 361/699; 165/80.3, 80.4, 80.5, DIG. 9, DIG. 171
See application file for complete search history.

(56) References Cited

U.S. PATENT DOCUMENTS

| | | | | |
|---|---|---|---|---|
| 4,899,211 A * | 2/1990 | Dumoulin | ........... | 257/714 |
| 5,625,227 A * | 4/1997 | Estes et al. | ........... | 257/712 |
| 5,768,103 A * | 6/1998 | Kobrinetz et al. | ........... | 361/699 |
| 5,901,040 A * | 5/1999 | Cromwell et al. | ........... | 361/704 |
| 6,219,243 B1 * | 4/2001 | Ma et al. | ........... | 361/704 |
| 6,313,994 B1 * | 11/2001 | Tantoush | ........... | 361/704 |
| 6,609,561 B2 | 8/2003 | Sauciuc et al. | | |
| 6,845,622 B2 | 1/2005 | Sauciuc et al. | | |
| 6,849,932 B2 * | 2/2005 | Tsai et al. | ........... | 257/675 |
| 6,868,898 B2 | 3/2005 | Chau et al. | | |
| 6,942,018 B2 * | 9/2005 | Goodson et al. | ........... | 165/80.4 |
| 6,967,840 B2 | 11/2005 | Chrysler et al. | | |
| 6,971,442 B2 | 12/2005 | Sauciuc et al. | | |
| 7,243,705 B2 | 7/2007 | Myers et al. | | |
| 7,259,965 B2 | 8/2007 | Chang et al. | | |
| 7,265,979 B2 | 9/2007 | Erturk et al. | | |
| 7,295,441 B1 * | 11/2007 | Laio et al. | ........... | 361/719 |

(Continued)

FOREIGN PATENT DOCUMENTS

JP 55165658 A * 12/1980

(Continued)

OTHER PUBLICATIONS

Kleiner, M. B., et al., "High performance forced air cooling scheme employing micro channel heat exchangers", *Components Packaging, and Manufacturing Technology, Part A, IEEE Transactions*, vol. 18, Issue: 4, (Dec. 1995).

(Continued)

*Primary Examiner*—Leonardo Andújar
*Assistant Examiner*—Teresa M Arroyo
(74) *Attorney, Agent, or Firm*—Zea Barlocci & Markvardsen

(57) ABSTRACT

Systems for cooling the backside of a semiconductor die located in a die-down integrated circuit (IC) package are described. The IC package is attached to the topside of a printed circuit board (PCB) with the backside of the die residing below the topside surface of the PCB. A cooling plate is attached to the backside of the die and thermally connected to a heat sink located above the topside surface of the PCB via conduits that pass through openings in the PCB.

6 Claims, 4 Drawing Sheets

U.S. PATENT DOCUMENTS

| | | | |
|---|---|---|---|
| 2005/0151244 A1* | 7/2005 | Chrysler et al. | 257/713 |
| 2005/0280140 A1* | 12/2005 | Corbin et al. | 257/706 |
| 2006/0005948 A1 | 1/2006 | Sauciuc et al. | |
| 2006/0033205 A1 | 2/2006 | Sauciuc et al. | |
| 2006/0090882 A1 | 5/2006 | Sauciuc | |
| 2006/0131003 A1 | 6/2006 | Chang et al. | |
| 2007/0000256 A1 | 1/2007 | Chau et al. | |
| 2007/0035927 A1 | 2/2007 | Erturk et al. | |
| 2007/0217147 A1 | 9/2007 | Chang et al. | |
| 2007/0230116 A1 | 10/2007 | Myers et al. | |

FOREIGN PATENT DOCUMENTS

| | | | |
|---|---|---|---|
| JP | 63066954 A | * | 3/1988 |

OTHER PUBLICATIONS

Radmehr, A. et al., "A flow network analysis of a liquid cooling system that incorporates micro channel heat sinks", *Thermal and Thermomechanical Phenomena in Electronic Systems, 2004 ITHERM*, The Ninth Intersociety Conference on , Jun. 1-4, 2004, pp. 714-721.

Sauciuc, I. et al., "Characteristics of two-phase closed thermosiphons for medium temperature heat recovery applications", *Heat Recovery Systems & CHP*, vol. 15, No. 7., (1995), pp. 631-640.

Liter, S. et al., "Pool Boiling CHF Enhancements by modulated porous layer: theory and experiment", *International Journal in Heat and Mass Transfer*, vol. 44., (2001), pp. 4287-4311.

"U.S. Appl. No. 11/479,584, filed Jun. 29, 2006."

"U.S. Appl. No. 11/862,444, filed Sep. 27, 2007."

"U.S. Appl. No. 11/771,909, filed Jun. 29, 2007."

Casarosa, C. et al., "The Geyser Effect in a Two-Phase Thermosyphon", *Int. J. Heat Mass Transfer*. vol. 26. No. 6, (1983), pp. 933-941.

Gross, U. "Reflux Condensation Heat Transfer Inside a Closed Thermosyphon", *Int. J. Heat Mass Transfer*. vol. 35, No. 2., (1992), pp. 279-294.

Zvirin, Yoram "The Instability Associated With the Onset of Motion in a Thermosyphon", (1985), pp. 2105-2111.

Sauciuc, Ioan et al., "The Design and Testing of an Improved Wick Structure to be used in Heat Pipes for Electronics Cooling Applications", (Mar. 2000), 6 pgs.

Sauciuc, Ioan et al., "Intel Developer Forum: Cooling Solutions for non-conventional applications", (Sep. 28, 2006), 44 pgs.

Prasher, Ravi S., et al., "Intel Technology Journal: Nano and Micro Technology-Based Next-Generation Package-Level Cooling Solutions", (Nov. 9, 2005), 14 pgs.

Sauciuc, Ioan et al., "Proceedings of IPACK2005: Thermal Performance and Key Challenges for Future CPU Cooling Technologies", (Jul. 2005), 12 pgs.

Chu, R. C., et al., "Review of Cooling Technologies for Computer Products", *Device and Materials Reliability, IEEE Transactions*, vol. 4, Issue: 4, (2004), pp. 568-585.

Tasaka, M. et al., "Cooling performance of heat sinks with corrugated-fins", *ITHERM3 98.*, (1998).

Shaukatullah, H. "Bibliography of liquid cooled heat sinks for thermal enhancement of electronic packages", *Semiconductor Thermal Measurement and Management Symposium*, (1999).

Upadhya, G. et al., "Electro-kinetic micro channel cooling system for servers", *ITHERM*, vol. 1,(2004), pp. 367-371.

Bierschenk, J. et al., "Extending the limits of air cooling with thermoelectrically enhanced heat sinks", *D.;Thermal and Thermomechanical Phenomena in Electronic Systems, 2004. ITHERM '04*. The Ninth Intersociety Conference on , Jun. 1-4, 2004, pp. 679-684.

Kim, S. J., "Analysis Methods for Thermal Optimization of Micro channel Heat Sink", *Heat Transfer Engineering*, vol. 25(1), (2004) pp. 37-49.

* cited by examiner

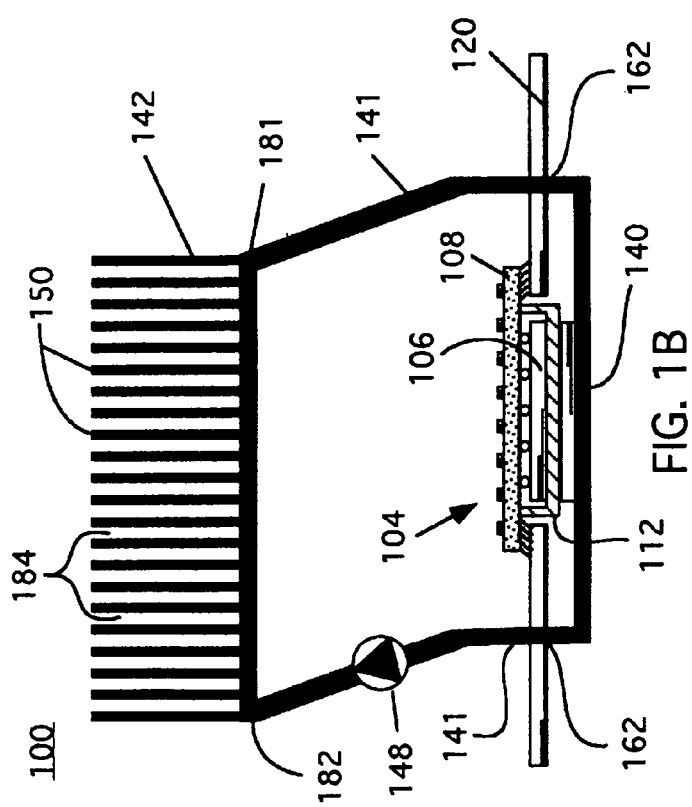
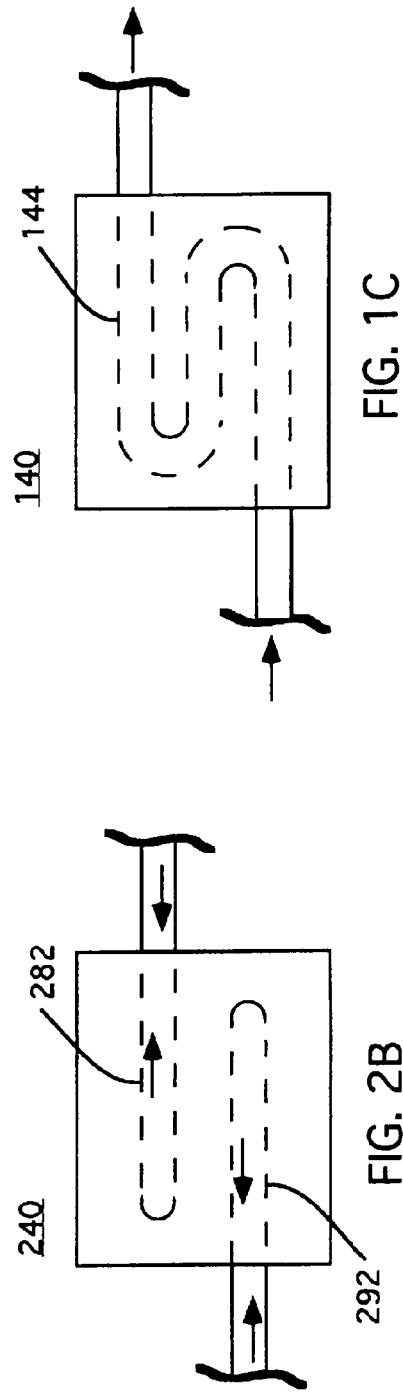
FIG. 1B
FIG. 1C
FIG. 2B

COOLING SOLUTIONS FOR DIE-DOWN INTEGRATED CIRCUIT PACKAGES

BACKGROUND

Integrated circuit (IC) packages are commonly used to interconnect a semiconductor die mounted in or on the package to a printed circuit board (PCB). Among other functions, the package acts to protect the die from environmental elements and to provide an electrical interface with the PCB. The substrate typically includes two sets of connectors (one set for connection to the die, the other set for connection to the PCB) that are generally interconnected by a multi-layered circuit. There exists a variety of methods for interconnecting the die to the package substrate and for interconnecting the substrate to the PCB. For example, in flip-chip packages an array of solder bumps connects the die to the package substrate. Other methods, such as, wire bonding, are also used. Pin grid arrays (PGAs), ball grid arrays (BGAs), land grid arrays (LGAs), and other known methods are commonly used to connect the substrate to the PCB.

Die-up and die-down packages currently exists. In die-up packages the IC die is mounted onto a top surface of the substrate opposite the surface that interconnects with the PCB. In die-down packages the die is mounted on the bottom surface of the substrate which is the same side that interconnects with the PCB. In die-down packages the die resides below the topside surface of the PCB. Because very little real estate exists below the PCB, temperature management of the die by the removal of heat from its backside presents a challenge.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 1A through 1D represent an assembly in one embodiment of the present invention.

FIGS. 2A and 2B represent an assembly in another embodiment of the present invention.

DETAILED DESCRIPTION

Figure 1A:
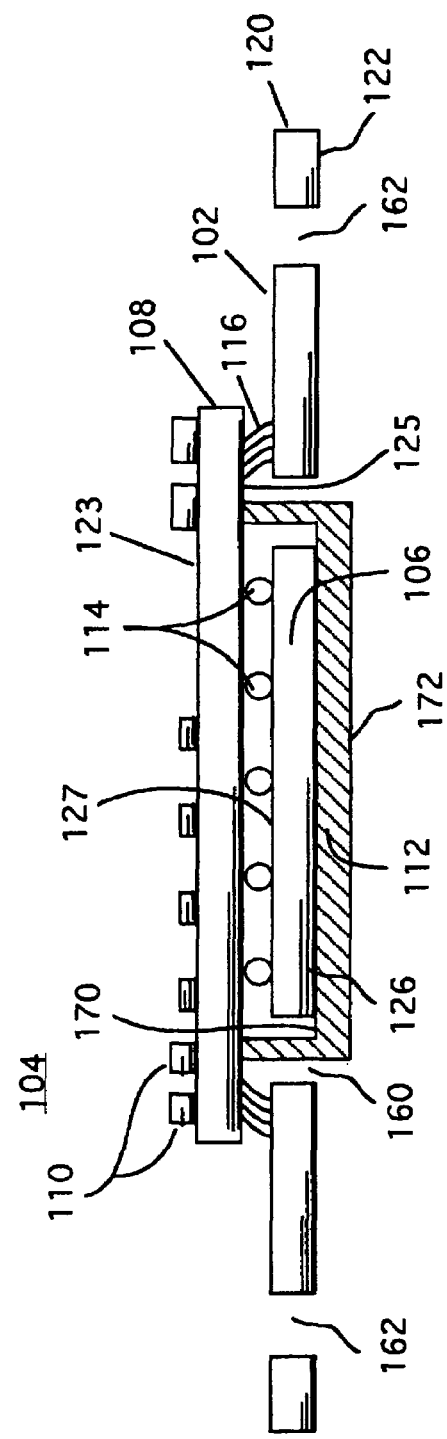

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

With reference to FIGS. 1A through 1D is shown an assembly 100 in accordance with one embodiment of the present invention. The assembly 100 includes a printed circuit board (PCB) 120 having a topside surface 102, an opposing backside surface 122, a first opening 160 and second openings 162, the first and second openings extending between the topside and backside surfaces 102 and 122. Attached to PCB 120 is a die-down integrated circuit (IC) package 104 that electrically connects a semiconductor die 106 carried by the IC package 104 to PCB 120. IC package 104 includes a circuit substrate 108 that resides above and is electrically connected to the PCB 120 by a first set of electrical connectors 116 that extend between the bottom surface 125 of substrate 108 and the topside surface 102 of PCB 120. Although the first set of electrical connectors 116 are shown as pins, it is appreciated that other types of connectors may be used, such as, for example, metallic bumps, lands, wires, etc.

What distinguishes die-down packages from die-up packages is the mounting location of the semiconductor die. In die-up packages the semiconductor die is mounted and electrically connected to the top surface of the package substrate with the connection to the PCB being made at the bottom surface of the substrate. In die-down packages, as shown in FIG. 1A, the die 106 and PCB 120 are both electrically coupled to the bottom surface 125 of the package substrate 108. The mounting of die 106 to the bottom surface 125 of substrate 108 frees space on the top surface 123 of the substrate 108 for the placement of other electronic components 110, such as capacitors and diodes. The first opening 160 in the PCB 120 facilitates the placement of die 106 below substrate 108 and provides access for cooling the backside surface of IC package 104 as will be discussed in detail below. In the embodiment of FIG. 1A, a second set of electrical connectors in the form of metallic bumps 114 (e.g., solder bumps) electrically connect the topside surface 127 of die 106 to the bottom surface 125 of substrate 108. It is appreciated, however, that the present invention is not limited by the method by which the die 106 is connected to substrate 108.

In a preferred embodiment, a heat spreader 112 is thermally coupled to the backside surface 126 of die 106. Heat spreader 112 is made of a high thermal conductive material (e.g., copper, aluminium, highly conductive composite materials, etc.) which provides a path for the removal of heat from the die 106. Heat spreader 112 also functions to physically protect the die 106 from external environmental elements. Coupling of the heat spreader 112 to die 106 can be made by use of a thermal interface material (TIM) (not shown) disposed between the inner surface 170 of heat spreader 112 and the backside surface 126 of die 106. Examples of TIM include solders, polymers, polymer gels, greases and polymer/solder hybrids. A thin gold layer (not shown) may be formed, or otherwise deposited, onto the backside surface 126 of die 106 and the inner surface 170 of heat spreader 112 to enhance wetting and bonding of the TIM to the respective surfaces. Attachment of the heat spreader 112 to the bottom surface 125 of substrate 108 is generally made by use of a silicone adhesive or other proprietary adhesive material.

Because there is no access to the IC die 106 from the topside surface 102 of PCB 120, traditional methods for removing heat away from the backside surface 126 of die 106 are not available due to space restrictions below the PCB. In accordance with the present invention, cooling solutions are provided for effectively removing heat from a semiconductor die housed within a die-down package. Each of the cooling solutions includes the use of a cooling plate located below the PCB, a heat sink located above the PCB, and a conduit for carrying a coolant between the cooling plate and heat sink.

With reference to FIGS. 1A through 1D, a cooling system in one embodiment of the present invention is illustrated. As shown, a cooling plate 140 is located below the backside surface 122 of PCB 120 and is thermally coupled to die 106 via the outside surface 172 of heat spreader 112. In an alternative embodiment the heat spreader 112 is omitted and cooling plate 140 is thermally attached directly to the backside surface 126 of die 106. A coolant channel 144 in cooling plate 140 is connected via conduits 141 to a baseplate 146 of a heat sink 142. Coolant channel 144 may comprise any configuration that permits passage of a coolant through cooling plate 140. In the embodiment of FIG. 1C a multi-pass cooling channel is provided. In another embodiment a plurality of parallel micro-channels extending across cooling plate 140 is provided.

Figure 1D:
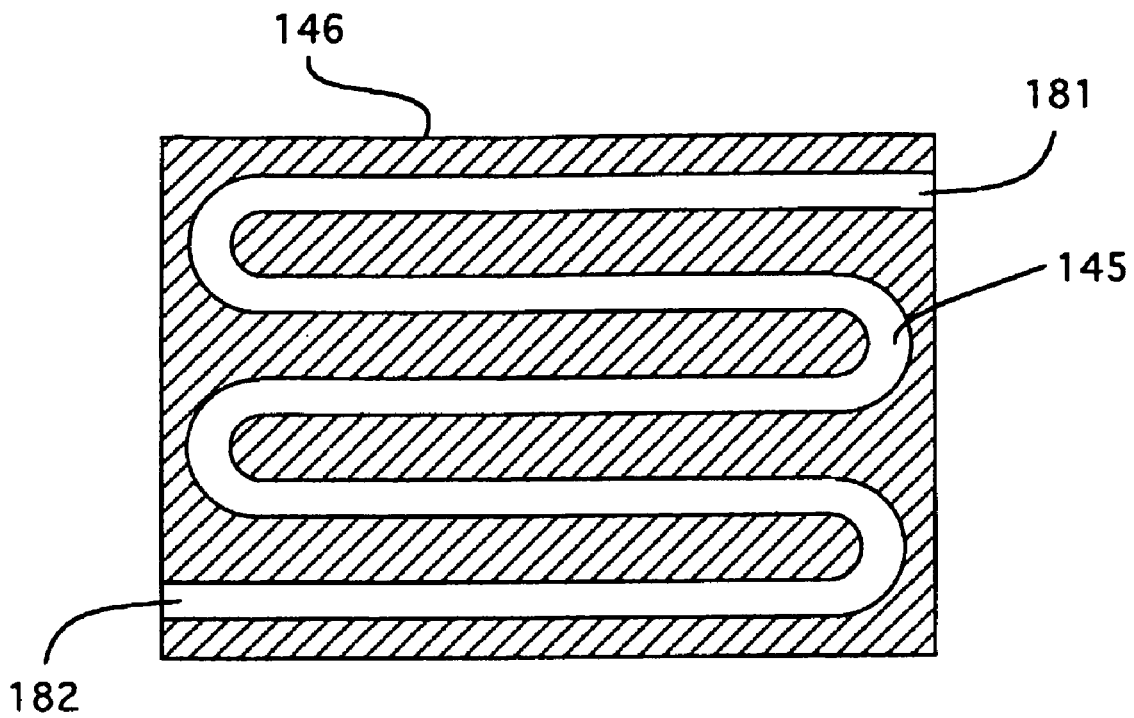

Passage of conduits 141 from the backside surface 122 to the topside surface 102 of PCB 120 is provided by the second openings 162 in the PCB. In one embodiment a motor driven pump 148 is provided to circulate the coolant in a counter-clockwise manner between the cooling plate 140 and the baseplate 146 of heat sink 142. Baseplate 146 includes one or more channels that carry coolant from a coolant inlet 181 to a coolant outlet 182. The coolant channels may comprise any configuration that permits passage of a coolant through baseplate 146. In one embodiment, a plurality of parallel channels carry the coolant between inlet and outlet manifolds located at the coolant inlet 181 and coolant outlet 182, respectively. In an alternative embodiment, a multi-pass channel 145 following a serpentine path carries the coolant between coolant inlet 181 and coolant outlet 182 as shown in FIG. 1D. Cooling plate 140 and baseplate 146 typically comprise solid blocks of a high thermal conductive material, such as copper or aluminium, with the coolant channels attached to or integrally formed therein. Threaded fittings, solder fittings, or other known methods may be used to connect conduits 141 to cooling plate 140 and baseplate 146.

Because the heat sink 142 is located above the PCB 120, conventional cooling methods may be used to transfer heat away from the heat sink. For example, in the embodiment of FIG. 1B heat sink 142 has a plurality of spaced-apart fins 150 attached to and extending upward from baseplate 146. Openings 184 between the fins 150 provide passage for a cooling medium, such as forced air, to carry heat away from heat sink 142. It is important to understand that the present invention is not limited to any particular heat sink configuration. A heat sink of the present invention need only have means for receiving a heated coolant from the cooling plate and the ability to remove heat from the coolant to some external source, such as ambient air.

In a preferred embodiment, the cooling system of FIG. 1B comprises a closed-loop, high pressure, and single phase (no boiling) cooling system. Coolants suitable for such cooling systems are proplyne glycol, potassium formate, dionized water, or any of a number of other liquids having relatively high boiling points and high thermal capacitance. High pressure tubing, rigid or flexible (e.g., rubber as used in radiators), may be used as the conduit between the cooling plate 140 and heat sink 142. The use of flexible tubing provides an advantage by permitting the heat sink 142 to be displaced relative to the IC package 104, thus providing design flexibility in the placement of computer components.

Figure 2A:
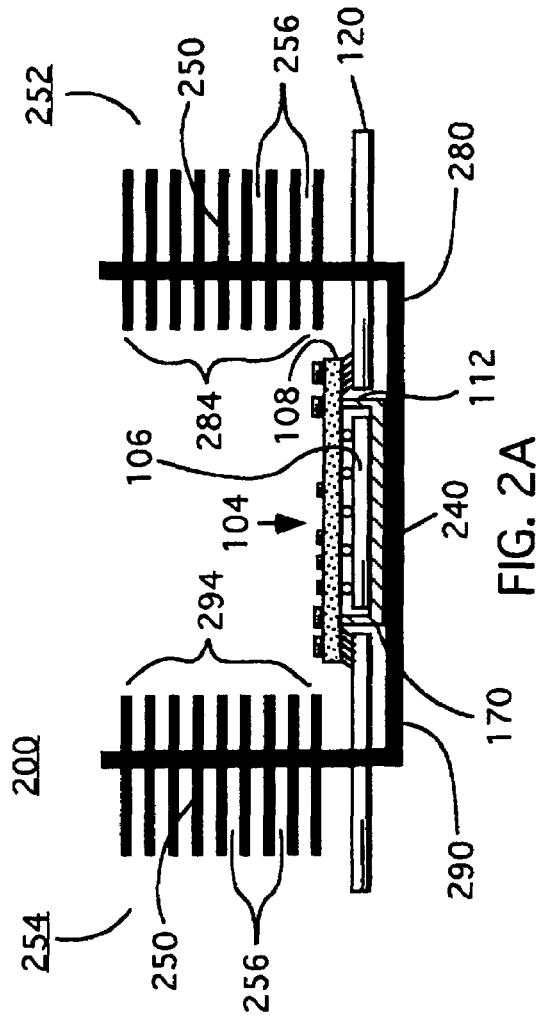

FIG. 2A illustrates an assembly 200 in another embodiment of the present invention. Like the embodiment of FIG. 1A, assembly 200 includes a die-down IC package 104 supporting a semiconductor die 106 that is mounted between the bottom surface 125 of the package substrate 108 and the inner surface 170 of heat spreader 112. The package substrate 108 is positioned on the topside surface 102 of PCB 120 with the die 106 residing below the topside surface 102 in the manner described above. The cooling system of the embodiment of FIG. 2A differs from that of FIG. 1B in that it uses heat pipes 280 and 290 to transport heat away from die 106 to heat sinks 252 and 254, respectively. Although FIG. 2A represents a cooling system having two heat pipes and two heat sinks, it will be appreciated that the invention may be practiced with only one heat pipe and one heat sink.

The cooling system of assembly 200 includes a cooling plate 240 thermally coupled to the outer surface 170 of heat spreader 112. In an alternative embodiment the heat spreader 112 is omitted and cooling plate 240 is thermally attached directly to the backside surface 126 of die 106. The cooling plate 240 has within it the closed-end segments 282 and 292 of heat pipes 280 and 290, respectively. Closed-end segments 282 and 292 constitute the evaporator portion of the heat pipes. Cooling plate 240 typically comprises a solid block of a high thermal conductive material, such as copper or aluminum, having openings for receiving the end segments of tubes 282 and 292. The opposite closed-end segments 284 and 294 of heat pipes 280 and 290 are located in, attached, or otherwise embedded into heat sinks towers 252 and 254 that extend upward above the topside surface 102 of PCB 120. Closed-end portions 284 and 294 constitute the condenser region of the heat pipe. In the embodiment of FIG. 2A, heat sinks 252 and 254 comprise spaced-apart fins 250 extending outward from the sides of the heat pipes with openings 256 for the passage of air or other cooling medium. Passage of heat pipes 280 and 290 from the backside surface 122 to the topside surface 102 of PCB 120 is provided by the second openings 162 in the PCB. Each of heat pipes 280 and 290 include a wick structure (not shown) extending between the opposite ends of the heat pipes.

In operation a coolant or working fluid in heat pipe 280 is heated within the closed-end segment 282 located in cooling plate 240 by heat flowing to it from the backside surface 126 of die 106. Within the cooling plate 240 the working fluid is boiled and undergoes a phase transformation from a liquid to a vapor. The vapor expands in volume and travels to the opposite closed-end segment 284 of heat pipe 280 where it is cooled and condenses to a liquid and gives up its heat. The liquid is then returned to the cooling plate 240 by capillary action through the wick structure located within the heat pipe 280. The working fluid can be water or ammonia in a negative pressure atmosphere or a fluid, such as Freon or hydroflourocarbons, which are pressurized to maintain its fluid state. Heat pipe 290 functions in the same manner as heat pipe 280 to transport a coolant between cooling plate 240 and heat sink 254.

Figure 3C:
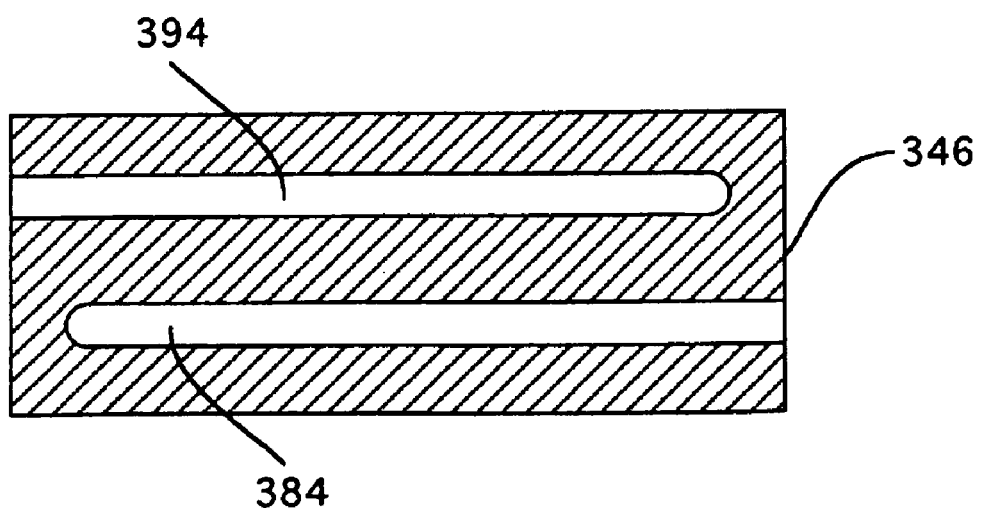
FIGS. 3A through 3C represent an assembly in yet another embodiment of the present invention.
Figure 3A:
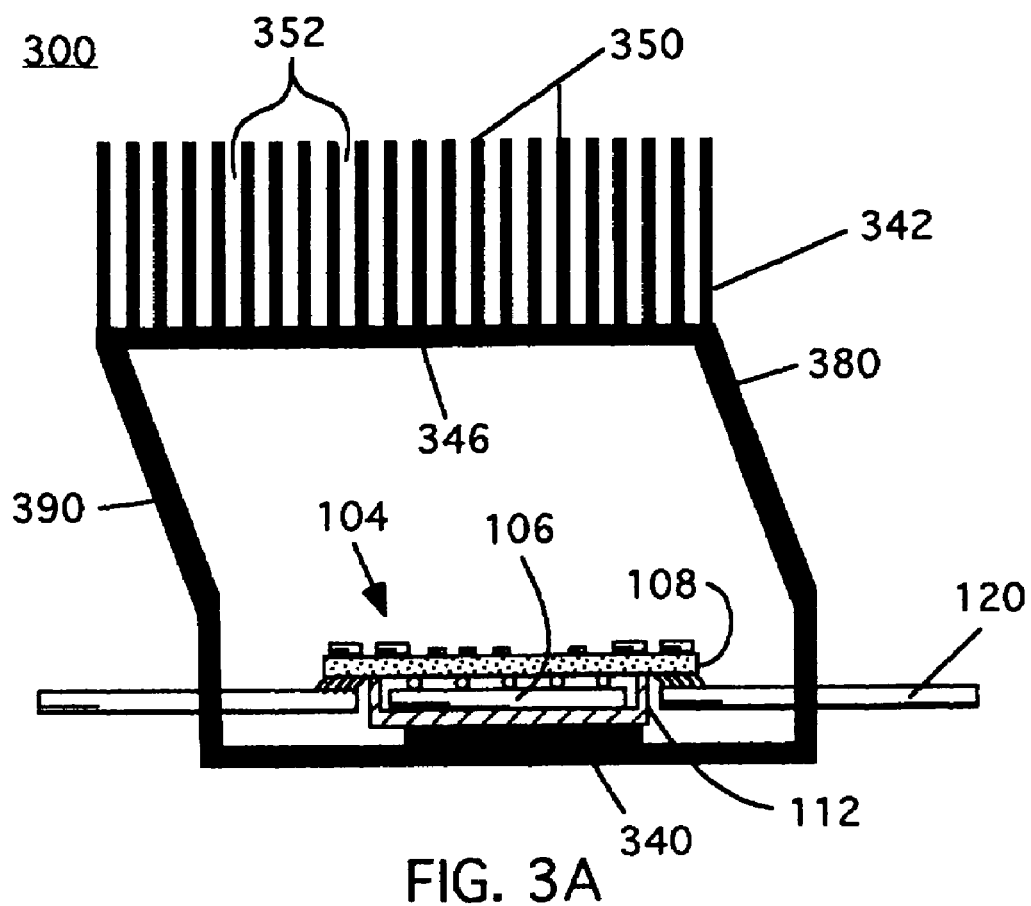
Figure 3B:
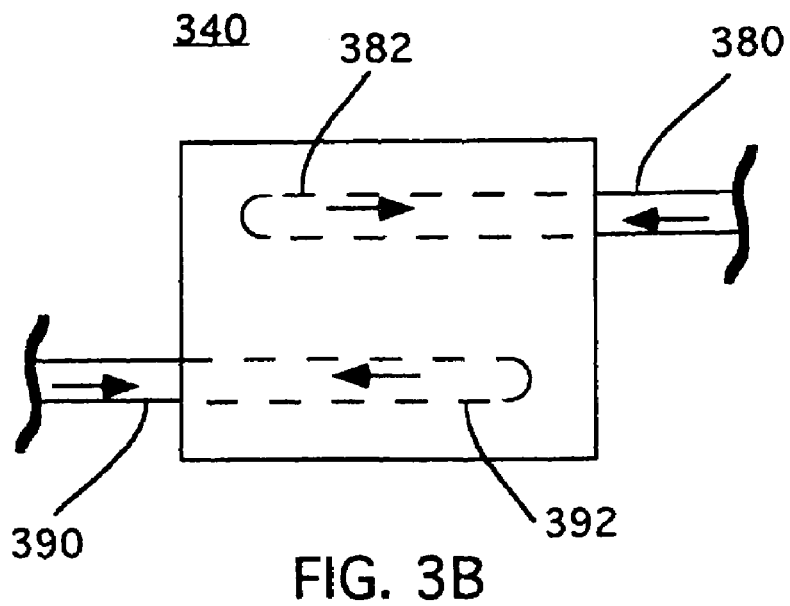

FIG. 3A illustrates an assembly 300 in another embodiment of the present invention. The embodiment of FIG. 3A differs from the embodiment of FIG. 2A in that it uses thermosiphon technology instead of heat pipe technology to transport coolant between a cooling plate and a heat sink. The principle difference between heat pipe and thermosiphon systems is that the latter uses temperature and gravity instead of temperature and capillary action to transport liquid between the condenser and evaporator segments. Because thermosiphon systems rely on gravity to return condensed coolant to their evaporator segments, they require that the condenser segments be located at least some z-distance with respect to gravity (i.e., above the evaporator segments). Thermosiphon systems have some advantages over heat pipe systems, particularly in use with the present invention where the heat sink is typically located above the cooling plate. One advantage is that a greater variety of coolants are available for use in thermosiphon systems. Another advantage is that thermosiphon systems may use flexible tubing, rigid tubing, or a combination thereof. The use of flexible tubing provides an advantage by permitting some flexibility in the placement of the heat sink, thus providing design flexibility in the placement of computer components.

The cooling system of assembly 300 includes a cooling plate 340 located below the backside surface 122 of PCB 120 that is thermally coupled to die 106 via the backside surface 172 of heat spreader 112. As discussed above with respect to the embodiments of FIGS. 1 and 2, the heat spreader 112 may be omitted so that cooling plate 340 is thermally attached directly to the backside surface 126 of die 106. The cooling plate 340 has within it the closed-end segments 382 and 392 of sealed tubes 380 and 390, respectively. The opposite closed-end segments 384 and 394 (see FIG. 3C) of tubes 380 and 390 are located within the baseplate 346 of heat sink 342 which is located above the topside surface 102 of PCB 120. The closed-end segments of tubing 380 and 390 may have within them structures to enhance or otherwise facilitate the evaporation and condensation of the coolant. The cooling plate 340 and baseplate 346 of heat sink 342 typically comprise solid blocks of a high thermal conductive material, such as copper or aluminum, having openings for receiving the end segments of tubes 380 and 390. In alternative embodiments, the openings provided in cooling plate 340 and/or heat sink 342 themselves comprise the closed-end segments of tubes 380 and 390. In such embodiments, fittings on the cooling plate 340 and/or baseplate 346 are provided for interconnecting tubing between the fittings. Similar to the heat sink shown in FIG. 1B, heat sink 342 includes spaced-apart fins 350 that are attached to and extend upward from baseplate 346. Openings 352 between the fins 350 provide passage for cooling medium, such as forced air, to carry heat away from heat sink 342.

In operation a coolant located within sealed tubing 380 is heated within the closed-end segment 382 located in cooling plate 340 by heat flowing to it from the backside surface 126 of die 106. Within the cooling plate 340 the working fluid is boiled and undergoes a phase transformation from a liquid to a vapor. The vapor expands in volume and travels to the opposite closed-end segment of tubing 380 located in the baseplate 346 of heat sink 342 where it is cooled and condenses to a liquid and gives up its heat. The liquid is then returned to the cooling plate 340 by gravity. The coolant can be water, ammonia or any of a variety of refrigerants. Thermosiphon tubing 390 functions in the same manner as tubing 380 to transport a coolant between cooling plate the 340 and baseplate 346 of heat sink 342. In the embodiment of FIG. 3C the condenser segments of both thermosiphon tubes reside in the same heat sink. In an alternative embodiment, the condenser segments of each thermosiphon tube 380 and 390 reside in separate heat sinks.

In an alternative embodiment of cooling assembly 300, a continuous closed-loop flow path is established between cooling plate 340 and the baseplate 346 of heat sink 342. In such an embodiment, cooling plate 340 and baseplate 346 may include cooling channels similar to those described in connection with the cooling plate and baseplate of cooling assembly 100 described above. Circulation of the coolant within the closed-loop system is induced by the phase transformation of the coolant within the cooling plate 340 and baseplate 346.

Other embodiments of the invention will be appreciated by those skilled in the art from consideration of the specification and practice of the invention. Furthermore, certain terminology has been used for the purpose of descriptive clarity, and not to limit the present invention. The embodiments and preferred features described above should be considered exemplary, with the invention being defined by the appended claims.

What is claimed is:

1. An assembly comprising:
a printed circuit board (PCB) having a topside surface, a backside surface, a first opening and one or more second openings extending between the topside and backside surfaces, the one or more second openings each being smaller than the first opening,
a die-down integrated circuit (IC) package comprising a substrate having a top surface and an opposing bottom surface, the bottom surface positioned above and electrically coupled to the topside surface of the PCB, a semiconductor die having a topside surface and a backside surface housed between a heat spreader and the bottom surface of the substrate, the heat spreader having an inside surface and an outside surface, the topside surface of the die electrically coupled to the bottom surface of the substrate, the backside surface of the die thermally coupled to the inside surface of the heat spreader, the outside surface of the heat spreader residing below the topside surface of the PCB,
a cooling plate located below and thermally coupled to the outside surface of the heat spreader,
a heat sink located above the topside surface of the PCB; and
one or more conduits for carrying a coolant between the cooling plate and the heat sink through the one or more second openings of the PCB.

2. The assembly of claim 1 wherein the cooling plate, heat sink and conduit function together as a heat pipe system.

3. The assembly of claim 1 wherein the cooling plate, heat sink and conduit function together as a thermosiphon system.

4. The assembly of claim 1 further comprising a pump for circulating the coolant between the cooling plate and the heat sink.

5. The assembly of claim 1 wherein the cooling plate comprises an evaporator, the heat sink comprises a condenser, the conduit comprises sealed tubing having an internal wick structure, and the coolant comprises a refrigerant.

6. The assembly of claim 1 wherein the cooling plate comprises an evaporator, the heat sink comprises a condenser, the conduit comprises sealed tubing and the coolant comprises a refrigerant.

* * * * *